United States Patent [19]

Pasch

[11] Patent Number: 5,700,715

[45] Date of Patent: Dec. 23, 1997

[54] PROCESS FOR MOUNTING A SEMICONDUCTOR DEVICE TO A CIRCUIT SUBSTRATE

[75] Inventor: Nicholas F. Pasch, Pacifica, Calif.

[73] Assignee: LSI Logic Corporation, Milpitas, Calif.

[21] Appl. No.: 434,276

[22] Filed: May 3, 1995

Related U.S. Application Data

[62] Division of Ser. No. 259,439, Jun. 14, 1994, abandoned.

[51] Int. Cl.$^6$ .................. H01L 21/283; H01L 21/58; H01L 21/60
[52] U.S. Cl. .................. 437/183; 228/180.22
[58] Field of Search .................. 437/183, 902; 228/180.22; 257/666, 663, 707, 733, 717, 727, 738, 780

[56] References Cited

U.S. PATENT DOCUMENTS

| | | | |
|---|---|---|---|
| 3,257,588 | 6/1966 | Mueller | 317/234 |
| 3,611,065 | 10/1971 | Zshauer et al. | 317/234 R |
| 3,871,015 | 3/1975 | Lim et al. | 357/67 |
| 3,893,156 | 7/1975 | Riseman | 557/67 |
| 4,545,610 | 10/1985 | Lakritz et al. | 24/584 |
| 4,551,747 | 11/1985 | Gilbert et al. | 357/74 |
| 4,600,273 | 7/1986 | Ohno | 350/336 |
| 4,878,611 | 11/1989 | Lovasco et al. | 228/180.22 |
| 4,950,623 | 8/1990 | Dishon | 437/183 |
| 5,056,215 | 10/1991 | Blanton | 228/180.22 |
| 5,089,876 | 2/1992 | Ishioka | 357/70 |
| 5,120,678 | 6/1992 | Moore et al. | 437/183 |
| 5,186,383 | 2/1993 | Melton et al. | 228/180.22 |
| 5,283,446 | 2/1994 | Tanisawa | 257/737 |
| 5,284,796 | 2/1994 | Nakanishi et al. | 228/180.22 |
| 5,341,564 | 8/1994 | Akhauain et al. | 437/183 |
| 5,400,950 | 3/1995 | Meters et al. | 238/180.22 |

FOREIGN PATENT DOCUMENTS

| | | | |
|---|---|---|---|
| 202109 | 11/1986 | European Pat. Off. | 257/508 |
| 532015 | 3/1993 | European Pat. Off. | |
| 2000657 | 9/1969 | France | 257/508 |
| 1903342 | 1/1969 | Germany | 257/508 |
| 2185050 | 7/1940 | Japan . | |
| 433348 | 2/1942 | Japan . | |
| 2294056 | 12/1946 | Japan . | |
| 53-14564 | 2/1978 | Japan . | |
| 53-103385 | 9/1978 | Japan | 357/659 |
| 56-50539 | 5/1981 | Japan . | |
| 57-36859 | 2/1982 | Japan | 257/659 |
| 59-119862 | 7/1984 | Japan | 257/659 |
| 59155162 | 9/1984 | Japan . | |
| 60-4257 | 1/1985 | Japan . | |
| 60-186057 | 9/1985 | Japan | 257/508 |

(List continued on next page.)

OTHER PUBLICATIONS

"Area Array Substrate-To-Carrier Interconnection Using Corner Standoff", *IBM T.D.B.*, vol. 24, No. 11, Apr. 1987, pp. 4736–4737.

"Pin Support For IC Chip To Prevent C4 Collapse During Reflow", *IBM T.D.B.*, vol. 30, No. 11, Apr. 1988. pp. 320–321.

*Primary Examiner*—David Graybill
*Attorney, Agent, or Firm*—Katz & Cotton, LLP

[57] ABSTRACT

A process for mounting one or more dies a substrate, such as by ball-bumps. In one embodiment, a thin layer of heat-reflective material, such as gold, is disposed over the surface of the die facing the substrate, to shield the substrate from heat generated by the die. Other embodiments are directed to "pillar" spacers formed on the surface of the die and/or the substrate to control the spacing therebetween. The pillars can be thermally-conductive or thermally non-conductive. Thermally-conductive pillars can be thermally isolated from the die or substrate by an insulating layer. Thermally-conductive pillars can be employed to extract heat from selected areas of a die, into selected lines or areas of the substrate, and the heat on the substrate can then be dissipated by a coolant. Lines on the substrate which are advertently heated by the die can be employed to limit the current of selected circuits on the semiconductor die.

10 Claims, 4 Drawing Sheets

FOREIGN PATENT DOCUMENTS

| | | |
|---|---|---|
| 61-97932 | 5/1986 | Japan . |
| 61-258471 | 11/1986 | Japan ............................ 257/508 |
| 63-117450 | 5/1988 | Japan . |
| 63-155734 | 6/1988 | Japan . |
| 181237 | 3/1989 | Japan . |
| 1-57735 | 5/1989 | Japan ............................ 357/659 |
| 1152637 | 6/1989 | Japan . |
| 1238148 | 9/1989 | Japan . |
| 266953 | 3/1990 | Japan . |
| 287629 | 3/1990 | Japan . |
| 318039 | 1/1991 | Japan . |
| 371649 | 3/1991 | Japan . |
| 3116838 | 5/1991 | Japan . |
| 419582 | 1/1992 | Japan . |
| 422130 | 1/1992 | Japan . |
| 462945 | 2/1992 | Japan . |
| 513667 | 1/1993 | Japan . |
| 6120225 | 4/1994 | Japan . |
| 2097581 | 11/1982 | United Kingdom ............ 257/508 |
| 8002891 | 12/1980 | WIPO ............................ 257/659 |

PROCESS FOR MOUNTING A SEMICONDUCTOR DEVICE TO A CIRCUIT SUBSTRATE

This is a divisional of commonly owned application Ser. No. 08/259,439, filed Jun. 14, 1994, abandoned.

TECHNICAL FIELD OF THE INVENTION

The present invention relates to the fabrication and packaging of semiconductor devices, particularly semiconductor assemblies employing superconductive interconnection substrates.

BACKGROUND OF THE INVENTION

In recent years, new materials have been discovered which exhibit super-conductivity at relatively high temperatures. Examples of these materials are thallium and YBCO (yttrium barium copper oxide). Thallium films, for example, have been found to be useful in microwave and RF applications.

Superconductive materials exhibit superconductivity (essentially the absence of any resistive effect whatsoever) only below a certain critical temperature. Above this temperature, the superconductive materials cease to behave as superconductors, and often exhibit extremely high resistance.

Superconductive materials have been arbitrarily divided into two main categories: high-temperature superconductors (HTS's) and low-temperature superconductors (LTS's). Low temperature superconductors are those which exhibit superconductivity only at temperatures below 30° K. (Kelvin). High temperature superconductors are those which remain superconductive at temperatures above 30° K. Some high-temperature superconductors, such as those based on Yttrium exhibit superconductivity at temperatures well over 100° K.

Such HTS superconductive materials are being considered for use in substrates for interconnecting semiconductor dies. In general, one or more dies may be connected by flip-chip techniques or by wire bonding to such substrates which have a pattern of (super) conductive lines for carrying signals and current to and from the semiconductor die(s). The use of solder bump technology has been successfully applied to connecting semiconductors to superconductive substrates. However, such surface mounting techniques suffer from a major drawback—namely, the close proximity of an operating semiconductor device generating heat to a superconductive substrate for which heat is anathema. (All semiconductor devices generate heat when they are operating, and heat-sinking is a major field of endeavor in semiconductor packaging technology.) Some sort of active cooling, such as immersion in liquid nitrogen, is typically required to avoid adverse conductivity transitions (e.g., from superconductive to resistive) in the superconductive substrate. Immersion in liquid nitrogen, or other form of active cooling, adds an undesirable level of complexity to the production and operation of a semiconductor device assembly (one or more dies mounted to an interconnect substrate). What is needed is a simpler, less complex technique for producing and operating semiconductor device assemblies employing superconductive interconnect substrates.

Another problem results from a current trend in integrated circuit (IC) design and fabrication, which is in the direction of smaller and smaller circuit elements, and placing more and more of these elements on a given semiconductor die (chip). The trend is driven by the desire to implement circuits of ever-increasing complexity and capability, and is facilitated by improvements in semiconductor fabrication equipment and processes.

As semiconductor devices are fabricated with more-and-more, smaller-and-smaller transistor structures on the die, there is a commensurate need to fabricate more-and-more, smaller-and-smaller conductive lines on the die. And, as operating speeds increase, disposing of heat generated by the operating die becomes a problem.

DISCLOSURE OF THE INVENTION

As used herein, the term "semiconductor device" includes any of a number of integrated circuit (IC) devices, including application-specific integrated circuits (ASICs), memory chips, logic chips, and other IC devices, and the term "semiconductor device assembly" is directed to one or more devices mounted to an interconnect substrate.

It is an object of the present invention to provide improved semiconductor device assemblies employing superconductors.

It is a further object of the present invention to provide a technique for shielding superconductive materials in a semiconductor device assembly from heat radiated by an operating semiconductor device.

It is a further object of the present invention to increase the amount of power which can be dissipated in a semiconductor device in an assembly employing superconductors in close proximity to the semiconductor device.

It is a further object of the present invention to provide a technique for controlling the spacing between a semiconductor die or substrate and a superconducting interconnect substrate.

It is a further object of the present invention to provide a technique for dissipating heat from localized "hot spots" in semiconductor device assemblies.

According to the invention, one or more semiconductor dies are solder-bump connected to a superconductive interconnect substrate. Generally, the circuit element containing face of the die will be in close proximity to and will face the interconnect substrate.

In one embodiment of the invention, a thin coating of gold of 0.5–20 µm (microns) in thickness, is deposited on the top of the semiconductor die. This thin coating of gold, or other suitable heat-reflective material, acts as a heat shield, and substantially decreases the amount of heat that will be transferred from the die to the interconnect substrate, thereby helping to maintain the superconductive materials of the interconnect substrate in their superconductive temperature regime. Generally, the technique of applying a reflective layer on the surface of the die works because of the high reflectivity of the gold coating to far-infrared radiation. The gold coating on the die significantly reduces the emission of far-infrared radiation from the die, and consequently reduces the heating of superconductive materials disposed in close proximity thereto.

According to an aspect of the invention, the gold (or other suitable material) coating is disposed on the surface of the die to a thickness of between 0.5 µm and 50 µm, and is preferably disposed to a thickness of between 0.5 µm and 20 µm.

Among the benefits accruing to the use of a heat-reflective coating on the die are:
- improved function of adjacent superconductive substrates; and
- the ability to connect more powerful (i.e., generating more heat) dies to a superconductive interconnect substrate.

Generally, the technique of the present invention requires disposing a thin coating of any material onto the die, so long as the material exhibits a high coefficient of reflectivity to far-infrared radiation. The thickness and choice of materials will be dictated by the particular application to which the inventive technique is applied (e.g., the die characteristics, the interconnect substrate characteristics, the proximity of the die to the substrate, environmental factors, and the like.)

A problem with the use of solder bump technology in effecting a connection of a die to a superconductive interconnect substrate is a lack of control over the spacing between the die and the substrate, and the generally small spacing in general. As mentioned hereinabove, the proximity of a hot silicon die to the superconductive substrate can lead to adverse conductivity transitions of the superconductive materials of the substrate.

In another embodiment of the invention, a controlled separation (spacing) is effected between the die and the substrate by means of spacing pillars disposed on the surface of the silicon substrate, the superconducting substrate, or both. The pillars are sized to control the collapse of the solder ball (bump) connections between the superconducting substrate and the silicon die (substrate) to maintain a controlled separation between the two substrates. In this manner, the known spacing can be modelled, and designed to minimize adverse effects of operating a silicon die in close proximity to a superconductive interconnect substrate. Also, the spacing between the two substrates can be maximized, in a controlled manner.

The use of the pillar structures will cause a controlled collapse of the solder ball structure to a predetermined separation distance (which would not otherwise occur, without the use of the pillars). The solder balls would otherwise (i.e., without the pillars) simply tend collapse (i.e., flatten out) to achieve a configuration exhibiting minimum surface area. The use of pillars between the two substrates constrains this tendency.

According to an aspect of the invention, the pillars themselves can be structured as insulators, or even as electrical conductors. In the event that electrically conductive pillars are used, electrical connections can be established between the semiconductor die and the superconducting interconnect substrate by means of the pillars using electrically conductive polymer materials (e.g., electrically conductive particle filled epoxy resin EPOTECH-type materials).

Further, according to the invention, the pillars can be formed of either thermally-insulating or thermally-conductive materials. In general, it is necessary to actively cool the semiconductor device assembly in a coolant such as liquid nitrogen in order to ensure that the superconductive material remains in a superconductive state. As such, every surface of the substrate (and die) is immersed in the coolant. With very high-speed or high-power semiconductor devices, however, localized "hot-spots" can occur within the die, potentially compromising the performance of both the die and the superconductor.

According to an aspect of the invention, one or more strategically placed thermally conductive pillars can be used to cause heat to flow from the hot spots of the die to the superconducting interconnect substrate. Since the superconducting interconnect substrate is completely immersed in coolant, it acts as a heat sink. Only a small portion of the surface area (a "guard area") of the superconducting interconnect substrate is elevated sufficiently in temperature to cause a conductivity transition (to non-superconductivity) of the superconductor.

According to an aspect of the invention, the "guard area" can be left "unwired" or reserved on the substrate for heat dissipation purposes.

According to another aspect of the invention, superconductive lines in the "guard area" can be reserved for use as heat detectors, where their transition to a non-superconductive state is used to operate protective mechanisms (e.g., to shut down an overheating circuit).

According to the invention, pillars formed from thermally (and/or electrically) conductive materials can be insulated with an embedded layer of a suitable insulating material (e.g., silicon dioxide or silicon nitride). The heat flux through a pillar that is highly thermally conductive can be significantly lowered by the interlayering of such an insulating material. The insulating layer can be thin with regard to the total pillar height and still effectively function as a significant restriction on heat flux. By virtue of its lower thermal conductivity coefficient, the insulating material tends to block or impede the flow of heat to the pillar. It is possible to pattern a silicon substrate with its electrically conductive and electrically insulating layers and to create a pattern of thermally conductive pillars on top of it with widely different heat flux coefficients.

According to an aspect of the invention, the pillars can be formed on either the semiconductor die or the superconducting interconnect substrate in a semiconductor device assembly.

According to another aspect of the invention, thermally conductive and thermally insulating pillars can be formed on the same substrate or die such that some pillars conduct heat well while others do not.

In a semiconductor device assembly employing superconductors where localized hot spots on the die are not a concern, pillars can be placed based upon mechanical considerations alone. However, where localized heat build up is a concern, pillars can be strategically placed to dissipate heat from such hot spots. The pillars can be thought of as a bridge between the two substrates. A thermally conductive pillar will simultaneously conduct heat away from a warm area of the silicon substrate (die) and put heat into an area of the superconductor substrate. The addition of heat to the superconductor in a controlled fashion can be very desirable. Local areas of the superconductor substrate can be rendered resistive by the appropriate addition of heat from a pillar which is strategically placed. This resistance can be used, for example, to control a regulating mechanism which governs the amount of power delivered to a specific circuit or group of circuits on the silicon substrate.

The ability of the pillar to lower the temperature of the silicon substrate can be equally desirable. The performance of semiconductor devices can be significantly improved by lowering the temperature of the silicon substrate. The electron and hole mobility in a doped silicon substrate is well known to peak in the region of about 60°–100° K. Evidently, the electrical resistance and the electromigration resistance of the most popular silicon substrate metallization materials are significantly improved (reduced) at cryogenic temperatures. Placing a cooling pillar in the area of a high current carrying trace on the silicon substrate can enhance the operation of circuitry on the silicon substrate. One of ordinary skill in the art will readily appreciate that the thermal conductivity of a pillar is determined by its shape and materials.

According to the invention, a grid of pillars can be created with significant differences in thermal conductivity from pillar to pillar across the grid, i.e., some pillars can be made more thermally conductive than others. The pillars can be used to control heat flux between the two substrates, in either a local-area or a large-area fashion. As such, cooling benefits on the semiconductor substrate unrelated to superconductivity can be realized using strategically placed thermally conductive/insulating pillars.

According to another aspect of the invention, the "pillar" techniques can be used in combination with the techniques of disposing a heat-reflective layer on the surface of the die, to multiply the advantages of controlled substrate spacing, thermal conductivity (and non-conductivity) effects of the pillars, and reflective heat-shielding, to ensure that the superconductive interconnect substrate remains superconductive.

Other objects, features and advantages of the invention will become apparent in light of the following description thereof.

DETAILED DESCRIPTION OF THE INVENTION

Figure 1:
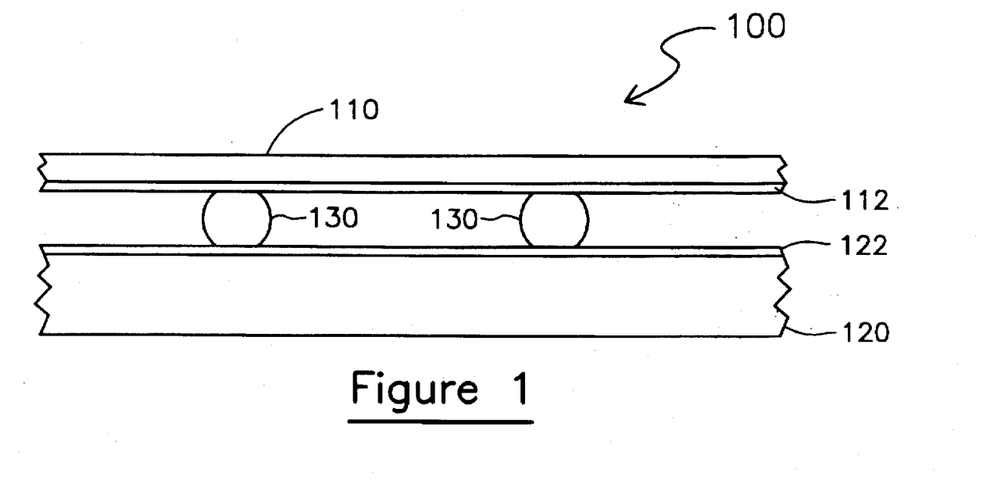
FIG. 1 is a cross-sectional view of a semiconductor device assembly employing a film heat shield on the die, according to the invention.

FIG. 1 is a cross-sectional view of a semiconductor device assembly 100, according to the invention. The assembly 100 includes one or more semiconductor dies 120 (one die shown) and an interconnect substrate 110. The substrate has a plurality of conductive, preferably superconductive lines.

The die is connected to the substrate by means of solder bump connections 130. The substrate 110 has a film 112 of patterned superconducting material on a surface thereof forming zero-resistance connections between points on the substrate. A thin gold film 122 is disposed on a surface of the semiconductor die facing the superconducting material 112.

The gold film 122 is highly reflective to far-infrared wavelengths and causes heat generated within the die 120 to be reflected back thereinto, effectively shielding the superconducting material 112 from radiated heat from the die 120. The gold film can be 0.5–50 μm in thickness and is preferably 0.5–20 μm in thickness.

By shielding the superconducting material 112 from radiated heat from the semiconductor die 120:
  there is less tendency for the material 112 to transition from superconductivity to non-superconductivity; and
  a greater amount of power can be dissipated by the semiconductor die 120 without causing a transition of the material 112 to non-superconductivity.

By using this technique, more robust semiconductor assemblies incorporating superconductive substrates can be produced, and higher power semiconductor device assemblies employing superconductor interconnection substrates can be built than would otherwise be possible.

Generally, it is the high reflectivity of gold with respect to wavelengths in the far-infrared region which provides the heat-shielding action. Accordingly, any other material which exhibits reflectivity to far-infrared wavelengths can be employed in place of gold. It is fully within the spirit and scope of the present invention to use a thin film of gold or any other suitable material over a radiating surface of a semiconductor die to serve as a reflective heat shielding material in such an assembly.

The discussion above with respect to FIG. 1 is directed to shielding superconductors from heat by means of a reflective heat shield. Other techniques, however, can be used to limit the amount of heat radiated from a semiconductor die to a superconducting interconnect substrate (i.e., a substrate using a superconductive material for electrical interconnections). Since radiated heat transfer decreases dramatically with increasing distance, one of ordinary skill in the art will immediately appreciate tsar increasing the spacing between a semiconductor die and a superconducting substrate beyond that which would ordinarily occur with solder bump contacts will be useful in decreasing radiated heat transfer between the substrates, thereby reducing the likelihood of a transition of the superconductor to non-superconductivity. Further, it will be appreciated that uncontrolled spacing between a die and a superconductive interconnect substrate would introduce an unacceptable variable into the manufacture of such assemblies.

According to the invention, pillar-shaped structures can be formed on the surface of the semiconductor die and/or the superconducting substrate to control the distance (spacing) between the die (or dies) and the substrate when they are solder bump bonded (connected) to one another. When the solder bump connections are formed, the pillars will act as spacers, limiting the collapse of the solder bumps to a height no smaller than the height of the pillars.

Figure 2A:
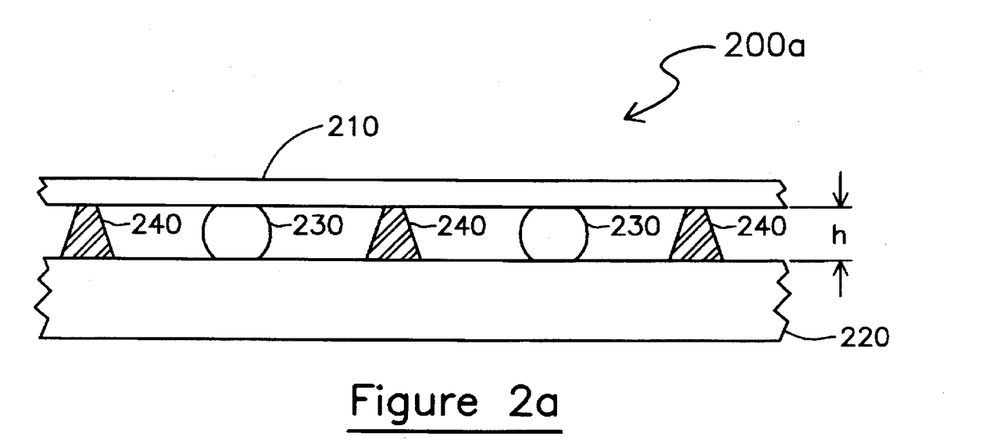
FIGS. 2a–2c are cross-sectional views of various embodiments of semiconductor device assemblies employing raised pillars between the die and the interconnect substrate, according to the invention.
Figure 2B:
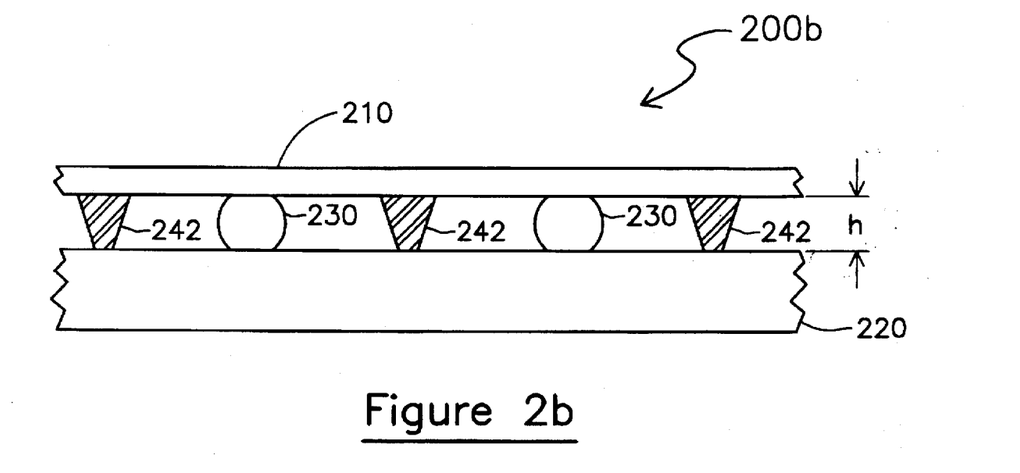

FIGS. 2a–2b are directed to using pillar spacers between a die and a superconducting interconnect substrate to maintain a controlled, limited spacing therebetween.

FIG. 2a is a cross-sectional view of a semiconductor device assembly 200a having a superconducting interconnect substrate 210 and one or more semiconductor dies 220 (one die shown), joined to one another mechanically and electrically by solder bump contacts 230.

Pillars 240 are disposed on the surface of the semiconductor die 220 facing the substrate 110, and are all of equal height "h". The pillars, extending as they do from the surface of the die, serve to limit the collapse of the solder bump contacts 230 during the formation thereof. The spacing between the die 220 and the superconducting interconnect substrate 210 is therefore limited to (and maintained) at a distance "d", which is equal to the height "h" of the pillars 240. The pillars can be formed in any suitable manner and of any suitable material, as is discussed hereinbelow.

FIG. 2b is a cross-sectional view of a semiconductor device assembly 200b, similar to the assembly 200a of FIG. 2a, but having pillars 242 disposed on the surface of the superconducting interconnect substrate 210 facing the die 220, rather than on the surface of the semiconductor die 220 facing the substrate. The function of these pillars 242 is the same as the function of the pillars 240 (FIG. 2a). Each of the pillars 242 has a height "h" which serves to limit the collapse of the solder bump contacts 230 during the formation thereof, and establishes/limits the spacing between the die 220 and the superconducting interconnect substrate 210 to a distance "h" (the height of the pillars). The pillars can be formed in any suitable manner and of any suitable material, as is discussed hereinbelow.

Figure 2C:
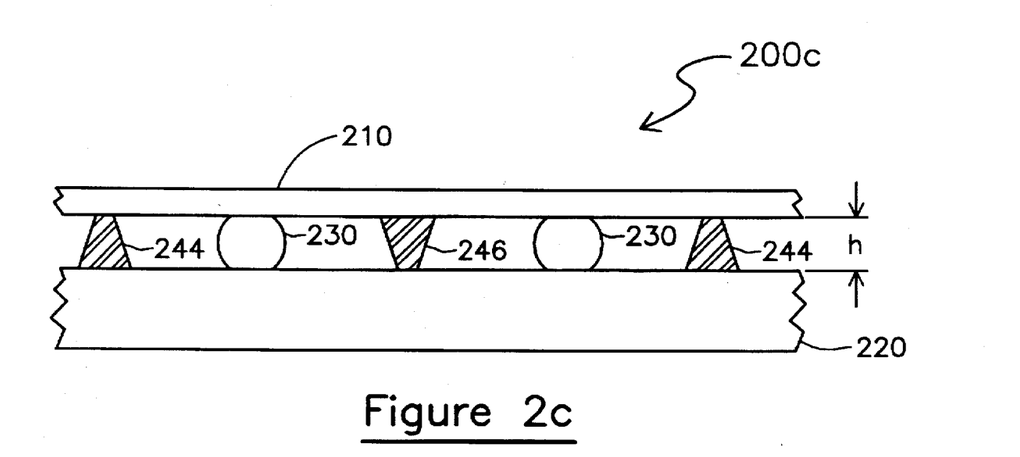

FIG. 2c is a cross-sectional view of another semiconductor device assembly 200c, similar to those of FIGS. 2a and 2b. In this example, pillars 244 are disposed on the surface of the semiconductor die 220 and pillars 246 (one shown) disposed on the surface of the superconducting interconnect substrate 210. Again, all of the pillars (244, 246) are of equal height "h", limiting the collapse of the solder bump contacts 230 during the formation thereof, and setting the space between the semiconductor die 220 and the superconducting interconnect substrate 210 equal to "h". The pillars can be formed in any suitable manner and of any suitable material, as is discussed hereinbelow.

In FIGS. 2a–2c, the pillars are shown having a tapered profile, wider on the bottom (where they are formed on the surface of the die or the substrate) than at the top. It should be understood that the pillars can be formed as:

cylinders (non-tapered, circular cross-section);

pyramids (tapered, polygonal cross-section);

truncated cones (tapered, circular cross-section);

polygonal solids (non-tapered, polygonal cross section); or in any shape suitable for effecting a "spacer" function.

The pillars themselves can be formed of an electrically insulating material, or of an electrically conductive material. In the case of electrically insulating materials, the pillars behave only as mechanical spacers between the die and the superconducting interconnect substrate. If electrically conducting pillars are employed, the some or all of the solder bump contacts can be replaced by the pillars themselves. In this case, the pillars would be connected to attachment points (e.g., bond pads, not shown) on the die and/or substrate by means of an electrically conductive polymer material (e.g., electrically conductive particle filled epoxy resin "EPOTECH"-type materials).

Further, according to the invention, the pillars can be formed of either thermally-insulating or thermally-conductive materials. In the context of keeping heat generated by the die away from the superconductive substrate, it might seem to make more sense to use only thermally-insulating materials for the pillar structures but, according to the invention, there are situations where thermal conductivity between selected points on the semiconductor die and the superconducting interconnect substrate is advantageous. The non-intuitive use of thermally-conductive pillar structures is disclosed herein.

It is typically necessary to actively cool a semiconductor device assembly employing a superconductive interconnect substrate in a coolant such as liquid nitrogen in order to ensure that the superconductive material remains (below a certain temperature) in a superconductive state. Generally, the entire substrate and die(s) would be immersed in the coolant. With very high-speed or high-power semiconductor devices, however, localized "hot-spots" can occur within the die, potentially compromising the performance of both the die (and, in some cases, the superconductivity of the substrate).

According to the invention, one or more strategically-positioned, thermally-conductive pillars can be employed to facilitate conduction of heat from hot spots of the die to the superconducting interconnect substrate. Since it is anticipated that the entire assembly (at least the superconducting interconnect substrate) will be immersed in a coolant, according to the invention, the superconducting interconnect substrate can function as a heat sink for the semiconductor die.

According to the invention, by the selective use of strategically placed thermally-conductive pillars, only a small portion of the surface area of the superconducting interconnect substrate will be elevated sufficiently in temperature to cause a conductivity transition (to non-superconductivity) of the superconductor. This area can be left "unwired" (i.e., not used for the purpose of effecting electrical interconnections), in effect "reserved" on the interconnect substrate for heat dissipation purposes. Additionally, superconductive lines in the hot areas can be employed for the function of heat detectors, in which case the conductivity of selected lines can be monitored (with an ohmmeter) to determine how much heat the die is dissipating. This feature can advantageously be employed to throttle back (e.g., reduce the clock speed of) or shut down a die (or portion thereof) which is determined to be destructively overheating itself.

According to the invention, pillars formed from thermally (and/or electrically) conductive materials can be electrically insulated, from the die or substrate upon which they are formed, with an embedded layer of a suitable insulating material (e.g., silicon dioxide or silicon nitride). However, the heat flow (flux) through a pillar that is highly thermally-conductive can be significantly lowered by the interposition of such an insulating material between the pillar and the heat source (e.g., the die). Therefore, the insulating layer is preferably made to be very thin with regard to the total pillar height. Nevertheless, even a thin heat-insulating layer, by virtue of its lower thermal conductivity coefficient, will tend to block or impede the flow of heat to the pillar. Therefore, according to the invention, it is possible to pattern a silicon substrate (die) with its electrically conductive and electrically insulating layers, and to create a pattern of thermally conductive pillars on top of it with widely different heat flux coefficients.

Figure 3A:
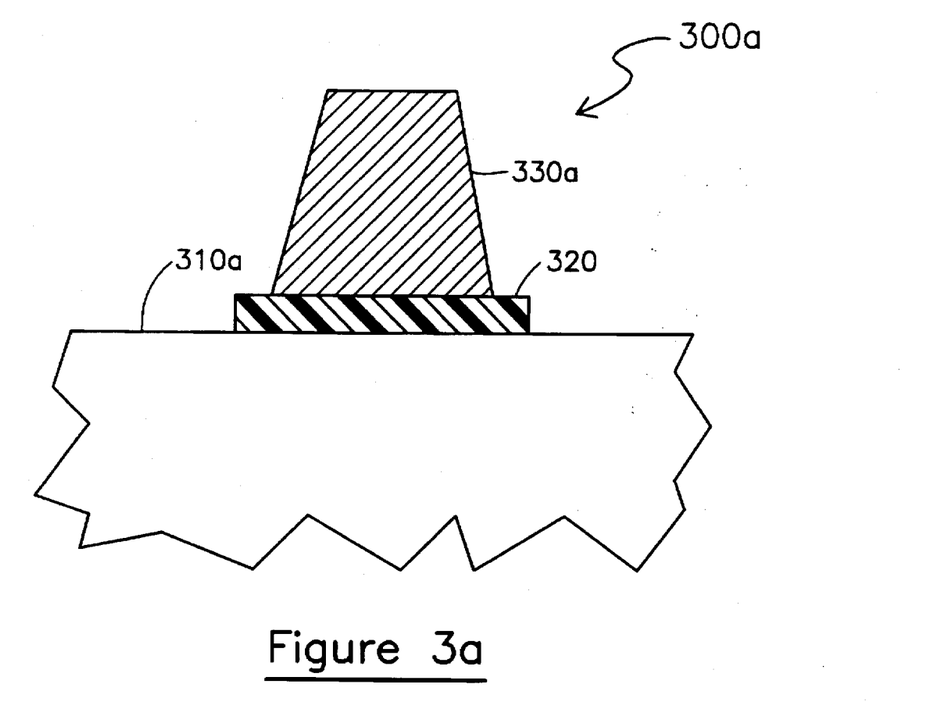
FIG. 3a is a cross-sectional view of a thermally insulated raised pillar, according to the invention.

FIG. 3a is a cross-sectional view of a portion of a semiconductor device assembly 300a showing a thermally-conductive pillar 330a formed on top of an insulating layer 320 on the surface of a die or substrate 310a. The insulating layer 320 is formed of any suitable material, such as silicon dioxide or silicon nitride. It will be readily appreciated by one of ordinary skill in the art that the pillar structure and interposed insulating layer can be readily formed by any of a number of widely known and practiced semiconductor fabrication techniques (e.g., photoresist masking, etching, depositing, sputtering, etc.).

Figure 3B:
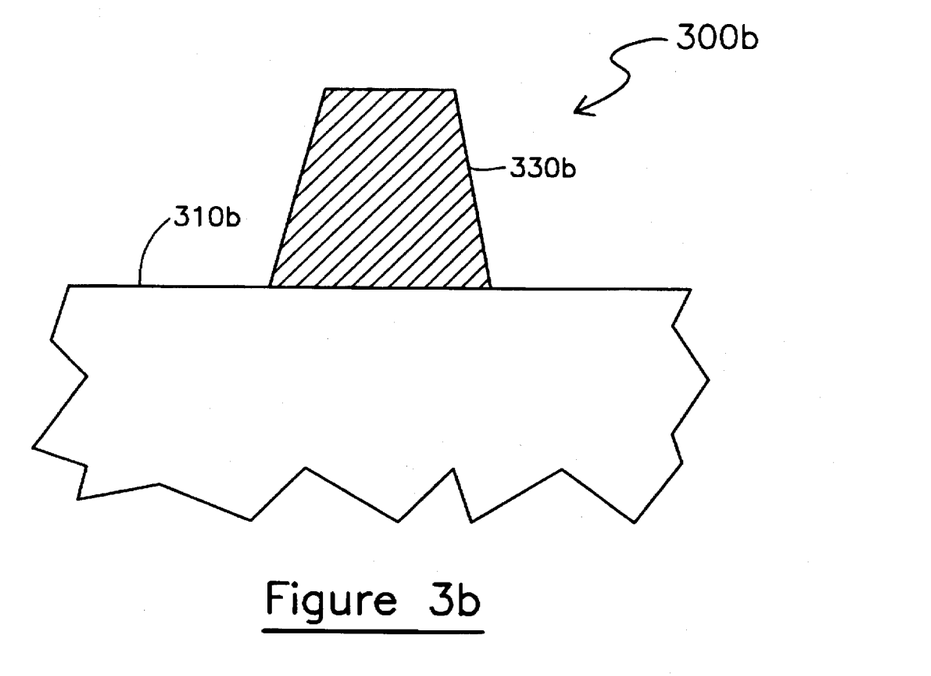
FIG. 3b is a cross-sectional view of a non-insulated, thermally conductive pillar, according to the invention.

By way of contrast, FIG. 3b is a cross-sectional view of another portion of a semiconductor device assembly 300b showing a thermally conductive pillar 330b formed directly on the surface of a die or substrate 310b. The pillar 330b is thermally-conductive, and is formed on the surface of the die without an interposed insulating layer 320 such as was shown in FIG. 3a.

In a manner similar to what was discussed with respect to FIGS. 2a–2c, the pillars 330a and 330b can be formed on either the semiconductor die or the superconducting interconnect substrate in a semiconductor device assembly. It will also be appreciated by one of ordinary skill in the art that both thermally-conductive and thermally-insulating pillars (e.g., of the types shown in FIGS. 3a and 3b) can be formed on the same substrate or die, so that selected ones of the pillars are good conductors of heat, and selected others of the pillars are good heat insulators.

In a semiconductor device assembly employing superconductors where localized hot spots on the die are not a concern, pillars can be placed based upon mechanical considerations alone. However, where localized heat build up is a concern, pillars can be strategically placed to dissipate heat from such hot spots. The pillars can be thought of as a bridge between the two substrates. A thermally-conductive pillar will simultaneously conduct heat away from a warm area of the silicon substrate (die) and put heat into a corresponding area of the superconductor substrate. According to the invention, the advertent heating of a superconducting interconnect substrate, in a controlled manner, can be very desirable. Local areas of the superconductor substrate can be rendered resistive by the appropriate addition of heat from a pillar which is strategically placed. This resistance can be used, for example, to control a regulating mechanism which governs the amount of power delivered to a specific circuit or group of circuits on the silicon substrate.

The ability of a thermally-conductive pillar to lower %he temperature of the silicon substrate can be equally desirable. The performance of semiconductor devices can be significantly improved by lowering the temperature of the silicon substrate. The electron and hole mobility in a doped silicon substrate is well known to peak in the region of about 60°–100° K. Evidently, the electrical resistance and the electromigration resistance of the most popular silicon substrate metallization materials are significantly improved (reduced) at cryogenic temperatures. Placing a cooling pillar in the area of a high current carrying trace on the silicon substrate can enhance the operation of circuitry on the silicon substrate.

It will readily be appreciated that the thermal-conductivity of a pillar will be determined by its shape and mass, and by the material from which it is formed. Examples of good thermal conductors are copper and copper alloys.

According to the invention, a grid (pattern) of pillars can be created with significant differences in thermal conductivity from pillar-to-pillar across the grid. In other words, some pillars can be made more thermally-conductive than others. The pillars can be used to control heat transfer between the two substrates (i.e., between the die and the interconnect substrate), in either a local-area or a large-area fashion. As such, cooling benefits on the semiconductor substrate (die) unrelated to superconductivity can be realized using strategically placed thermally conductive/insulating pillars.

Figure 4:
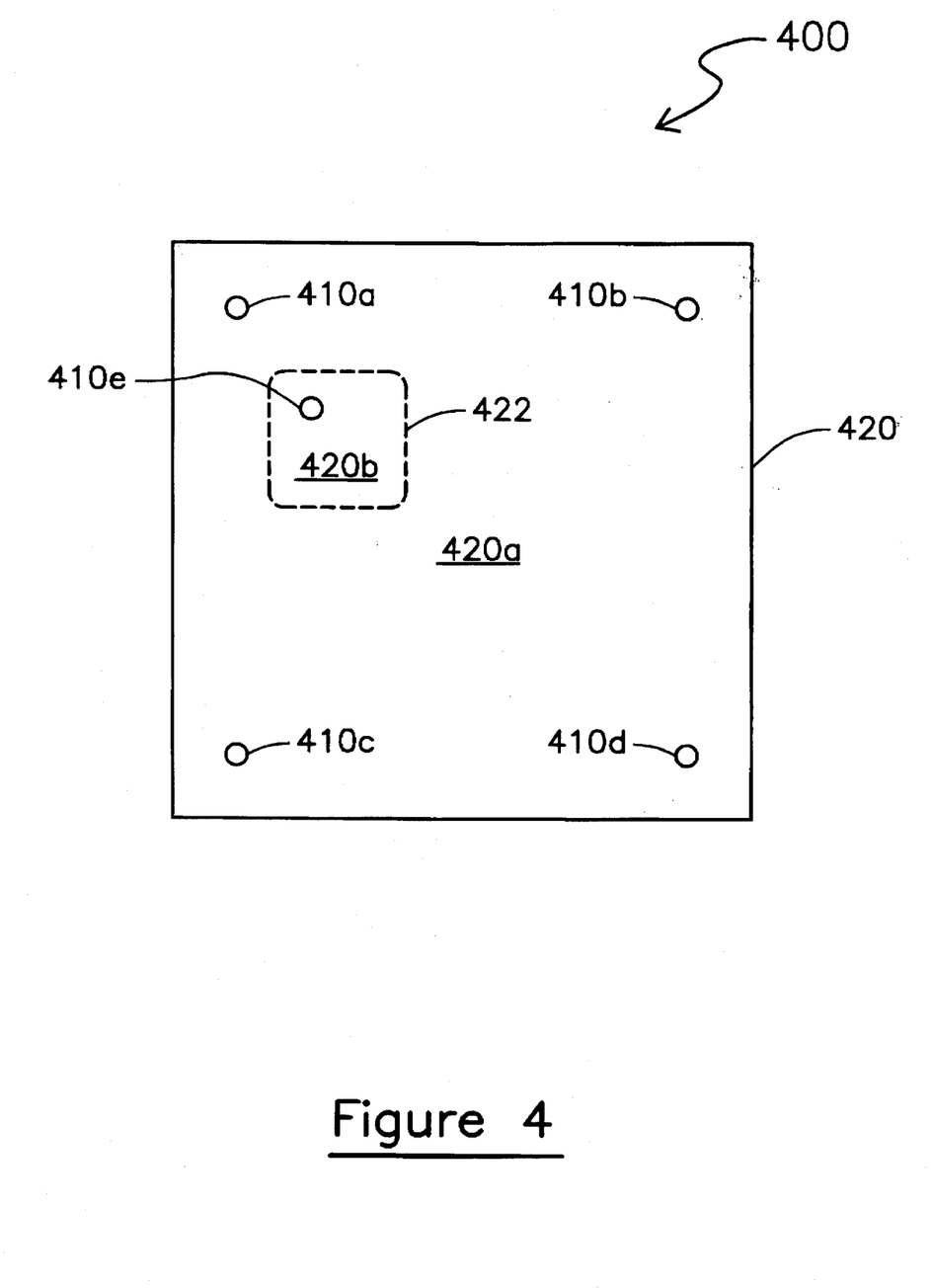
FIG. 4 is a top view of a substrate designed for selective, localized conduction of heat, according to the invention.

FIG. 4 is a top (plan) view of a superconductive interconnect substrate 400 designed for selective, localized conduction of heat away from a die, according to the invention. (A pattern of conductive lines is omitted, for illustrative clarity.) The substrate 420 has areas 420a and 420b defined on the surface thereof. The area 420b is essentially a "guard" area around the site of a thermally-conductive pillar 410e. Thermally nonconductive pillars sites 410a, 410b, 410c, and 410d are arranged within the area 420a outside of the guard area 420b. The thermally non-conductive pillars 410a–d can be formed as described hereinabove with respect to FIG. 3a, or alternatively can be formed of a thermally-insulating material. Since there is a thermally conductive pillar 410e, it is advantageous to form all of the pillars of the same (thermally conductive) material and to provide an embedded thermal barrier (layer) for those pillars which are to be non-conductive of heat (410a–d). In other words, all of the pillars 410a–e can be formed of the same thermally-conductive material, and selected ones (e.g., 410e can be formed directly on the die (or the interconnect substrate) as in FIG. 3b, and selected others (e.g., 410a–d) can be formed with an insulating layer as in FIG. 3a.

The guard area 420b around the site of the thermally conductive pillar 410e will experience some heating due to heat transmission via the thermally conductive pillar 410e. Accordingly, critical superconductive traces (i.e., those which must remain superconductive) are routed outside of the guard area 420b, to the unaffected (non-heated) area 420a. As described hereinabove, thermally-induced conductivity transitions of superconductive traces (lines) disposed within the guard area 420b can be employed as thermal "fusing" devices to control the amount of power dissipated in a "hot spot" on a die to which the thermally conducting pillar 410e is thermally connected. (Unlike conventional "fuses", however, superconductors behave more like thermal "circuit breakers" which return to superconductivity once the necessary cold temperature is restored.) For example, a power trace to a CMOS circuit disposed on a die under the guard area 420b could be routed through the guard area to prevent latch-up damage.

It should be noted that it is fully within the spirit and scope of the present invention to employ the inventive techniques of the invention either alone or in combination with one another. For example, the "pillar" techniques described hereinabove with respect to FIGS. 2a–c, 3a–b, and 4 can be used in combination with a metallic, reflective heat shield of the type described hereinabove with respect to FIG. 1 to combine substrate spacing, thermal conductivity (and non-conductivity) effects of the pillars, and reflective heat-shielding in a single semiconductor device assembly.

What is claimed is:

1. A method of making a semiconductor device assembly, comprising the steps of:

providing a semiconductor substrate having a surface;

forming a layer of heat-reflective material on the surface of the semiconductor substrate, the heat-reflective material being electrically insulated from heat producing active devices in the semiconductor substrate;

providing an interconnect substrate having a surface;

forming thermally conductive pillars on the surface of at least one of the substrates, wherein the thermally conductive pillars conduct heat from the semiconductor die to the interconnect substrate;

forming solder bumps on the surface of at least one of the substrates:

positioning the semiconductor substrate so that the surface of the semiconductor substrate faces the surface of the interconnect substrate;

forming interconnections between the surfaces of the substrates with the solder bumps such that the distance between the substrates is determined by the height of the conductive pillars;

providing a guard area on a portion of the surface of the interconnect substrate; and providing at least one of the thermally conductive pillars such that when the substrates are assembled to one another, the at least one of the thermally conductive pillars extends between the semiconductor substrate and the guard area.

2. Method, according to claim 1, wherein:

the interconnect substrate has superconducting traces on the surface thereof.

3. Method, according to claim 1 further comprising the step of:

forming at least one thermally insulated pillar on the surface of at least one of the substrates, wherein the at least one thermally insulated pillar determines the distance between the substrates.

4. Method, according to claim 3, wherein:
the thermally insulated pillar is made of thermally insulating material.

5. Method, according to claim 3, wherein:
the thermally insulated pillar is made by:
   forming a layer of thermally insulating material on a portion of the surface of one of the substrates; and
   forming a pillar made of thermally conductive material on the layer of thermally insulating material.

6. Method, according to claim 5, wherein the layer of thermally insulating material is silicon dioxide.

7. Method, according to claim 5, wherein me layer of thermally insulating material is silicon nitride.

8. Method, according to claim 1, further comprising:
providing at least one thermally-insulating pillar extending between the semiconductor substrate and the interconnect substrate outside of the guard area.

9. Method, according to claim 1, further comprising:
providing superconducting traces on the surface of the interconnect substrate outside of the guard area.

10. Method, according to claim 1, further comprising:
providing superconducting traces on the surface of the interconnect substrate within the guard area.

* * * * *